(12) United States Patent
Eustis et al.

(10) Patent No.: US 7,404,125 B2
(45) Date of Patent: Jul. 22, 2008

(54) COMPILABLE MEMORY STRUCTURE AND TEST METHODOLOGY FOR BOTH ASIC AND FOUNDRY TEST ENVIRONMENTS

(75) Inventors: Steven M. Eustis, Essex Junction, VT (US); James A. Monzel, North Ferrisburg, VT (US); Steven F. Oakland, Colchester, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 623 days.

(21) Appl. No.: 10/906,147

(22) Filed: Feb. 4, 2005

(65) Prior Publication Data

US 2006/0176745 A1 Aug. 10, 2006

(51) Int. Cl.
*G01R 31/28* (2006.01)
(52) U.S. Cl. ............................... 714/726; 714/733
(58) Field of Classification Search ................. 714/727, 714/729, 718, 726, 733
See application file for complete search history.

(56) References Cited

U.S. PATENT DOCUMENTS

| 5,598,120 | A | 1/1997 | Yurash | 327/202 |
|---|---|---|---|---|
| 5,719,879 | A | 2/1998 | Gillis et al. | 371/22.3 |
| 5,920,830 | A | 7/1999 | Hatfield et al. | 702/119 |
| 5,925,143 | A | 7/1999 | Gillis et al. | 714/726 |
| 5,946,472 | A | 8/1999 | Graves et al. | 395/500 |
| 6,028,983 | A | 2/2000 | Jaber | 395/183.06 |
| 6,185,710 | B1 * | 2/2001 | Barnhart | 714/727 |
| 6,195,775 | B1 | 2/2001 | Douskey et al. | 714/727 |
| 6,385,749 | B1 * | 5/2002 | Adusumilli et al. | 714/733 |

(Continued)

FOREIGN PATENT DOCUMENTS

EP 0578858 A1 1/1994

(Continued)

OTHER PUBLICATIONS

S.M. Douskey, ""Method and Design for Applying Stuck Faults in an LSSD Boundary Scan Environment;"" IBM Technical Disclosure Bulletin, vol. 34, No. 10B, Mar. 1992; pp. 444-446.

*Primary Examiner*—David Ton
(74) *Attorney, Agent, or Firm*—Cantor Colburn LLP; Michael J. LeStrange

(57) ABSTRACT

A memory structure configured for supporting multiple test methodologies includes a first plurality of multiplexers configured for selectively coupling at least one data input path and at least one address path between an external customer connection and a corresponding internal memory connection associated therewith. A second multiplexer is configured for selectively coupling an input of a test latch between a functional memory array connection and a memory logic connection coupled to the at least one data input path, with an output of the test latch defining a data out customer connection. Flush logic is further configured to direct data from the memory logic connection to the data out customer connection during a test of logic associated with a customer chip, thereby facilitating observation of the memory logic connection at the customer chip, wherein test elements of the memory structure comprise a scan architecture of a first type, and test elements of the customer chip comprise a scan architecture of a second type.

7 Claims, 3 Drawing Sheets

"

U.S. PATENT DOCUMENTS

| | | | |
|---|---|---|---|
| 6,567,943 B1 * | 5/2003 | Barnhart et al. | 714/727 |
| 6,701,476 B2 * | 3/2004 | Pouya et al. | 714/727 |
| 7,272,761 B2 * | 9/2007 | Rich et al. | 714/726 |
| 7,272,764 B2 * | 9/2007 | Rich et al. | 714/733 |
| 2003/0074618 A1 | 4/2003 | Dorsey | 714/733 |

FOREIGN PATENT DOCUMENTS

| | | |
|---|---|---|
| JP | 2003208331 A | 4/2003 |

* cited by examiner

| TEST M1 | TEST M3 | L1 FLUSH | |
|---|---|---|---|
| 0 | 0 | 0 | (FUNCTIONAL MODE) |
| 0 | 1 | 1 | (TEST FOUNDRY LOGIC) |
| 1 | 1 | X | (TEST ASIC LOGIC) |
| 1 | 0 | X | (BIST AND REPAIR) |

*FIG. 2*

COMPILABLE MEMORY STRUCTURE AND TEST METHODOLOGY FOR BOTH ASIC AND FOUNDRY TEST ENVIRONMENTS

The present invention relates generally to integrated circuit devices, and, more particularly, to a compilable memory structure and test methodology for both application specific integrated circuit (ASIC) and foundry test environments.

As the packing density of integrated circuit chip devices has increased greatly in recent years, various schemes have been devised for providing increased testability of the devices. For example, if it is desired to operate an integrated circuit from a known initial state, it is often necessary to be able to input states into the various latches and flip-flops from an external data pin. It is further useful to be able to test the integrated circuit by shifting a test vector comprised of a sequence of bits through a chain of latches and/or flip-flops to ensure the integrated circuit is functioning properly. To this end, the various storage elements have been designed so as to have two modes of operation. In a first mode of operation, the storage elements are set in a "functional" mode such that the integrated circuit performs its normal operational tasks. In a second or "shift" mode, data is shifted through the storage elements and out through an output pin of the integrated circuit for diagnostic analysis.

One particularly effective testing scheme employs a level sensitive scan design (LSSD) in which separate system and scan clocks are used to distinguish between normal and test modes. In particular, latches are used in pairs, wherein each has a normal data input, data output and clock for system operation. In the functional mode, the storage element is a level sensitive latch that is controlled by the system clock. In the shift mode, the two latches form a master/slave pair with one scan input, one scan output, and non-overlapping scan clocks A and B that are held low during system operation but cause the scan data to be latched when pulsed high during scan.

On the other hand, a more common methodology for creating storage elements having two modes of operation is known as the multiplexed flip-flop (or "muxed" flop) design, in which the addition of a multiplexer to each flip flop's data input allows operation in either the normal mode or the shift mode. The output of each flip-flop goes to the normal functional logic as well as to the scan input of the next multiplexer in the scan path. Essentially, the input multiplexers are used to isolate each scan node. The muxed flop design is the most widely used type of scan element for foundry chip designs, whereas an LSSD design has been used for certain application specific integrated circuit (ASIC) chips.

In the past, separate embedded memory designs have been used for ASIC chips and for foundry chip designs. However, in order to save both development time and costs, it would be desirable to be able to have a single embedded memory that is capable of being tested in both environments. Unfortunately, however, conventional memory circuit designs do not allow for the simultaneous testing of logic that includes both LSSD scan elements and muxed flop scan elements. For example, a node in an LSSD scan chain is not observable by a muxed flop scan element. As such, automated test patterns cannot presently be applied to a "dual scan architecture" device in a manner that would provide complete testability of the logic.

SUMMARY

The foregoing discussed drawbacks and deficiencies of the prior art are overcome or alleviated by a memory structure configured for supporting multiple test methodologies. In an exemplary embodiment, the memory structure includes a first plurality of multiplexers configured for selectively coupling at least one data input path and at least one address path between an external customer connection and a corresponding internal memory connection associated therewith. A second multiplexer is configured for selectively coupling an input of a test latch between a functional memory array connection and a memory logic connection, the memory logic connection coupled to the at least one data input path, with an output of the test latch defining a data out customer connection. Flush logic is further configured to direct data from the memory logic connection to the data out customer connection during a test of logic associated with a customer chip, thereby facilitating observation of the memory logic connection at the customer chip, wherein test elements of the memory structure comprise a scan architecture of a first type, and test elements of the customer chip comprise a scan architecture of a second type.

In another embodiment, a method of implementing a compilable memory structure configured for supporting multiple test methodologies includes configuring a first plurality of multiplexers for selectively coupling at least one data input path and at least one address path between an external customer connection and a corresponding internal memory connection associated therewith. A second multiplexer is configured for selectively coupling an input of a test latch between a functional memory array connection and a memory logic connection, the memory logic connection coupled to the at least one data input path, with an output of the test latch defining a data out customer connection. Flush logic is further configured to direct data from the memory logic connection to the data out customer connection during a test of logic associated with a customer chip, thereby facilitating observation of the memory logic connection at the customer chip, wherein test elements of the memory structure comprise a scan architecture of a first type, and test elements of the customer chip comprise a scan architecture of a second type.

In still another embodiment, a method for implementing a plurality of test methodologies for a memory structure includes setting a first test configuration in the memory structure in accordance with a first test methodology corresponding to a first scan architecture, setting a second test configuration in the memory structure in accordance with a second test methodology corresponding to a second scan architecture; and setting a third test configuration in the memory structure in accordance with a third test methodology corresponding to a built-in self test (BIST) and repair mode of the memory structure.

BRIEF DESCRIPTION OF THE DRAWINGS

Referring to the exemplary drawings wherein like elements are numbered alike in the several Figures:

FIG. 2 is a truth table illustrating the selection of values for the control signals corresponding to the various test and functional modes of the dual architecture memory system.

DETAILED DESCRIPTION

Disclosed herein is an embedded memory device (e.g., SRAM) that may be tested and used in both ASIC and foundry environments (i.e., first scan architecture and second scan architecture environments). Briefly stated, an ASIC memory device is configured to include foundry-only observable pins that are connected in a manner so as to be harmless in an ASIC test environment. Conversely, the memory device also includes observable ASIC-only pins that are held harmless in a foundry test environment.

Figure 1:
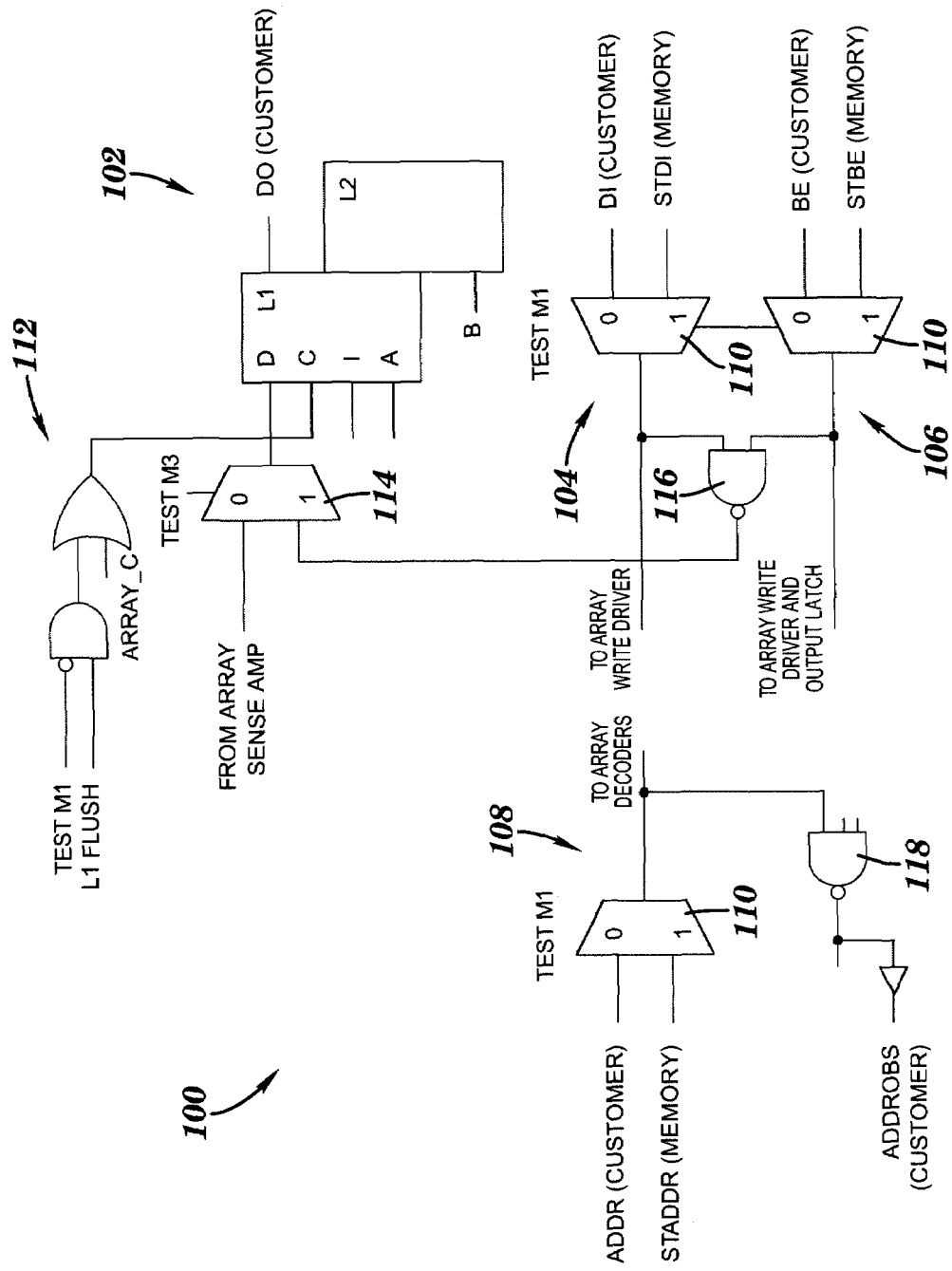
FIG. 1 is a schematic diagram of a logic portion of an ASIC, such as an SRAM, configured in accordance with an embodiment of the invention.

Referring initially to FIG. 1, there is shown a schematic diagram of a logic portion of an ASIC, such as an SRAM 100 for example, configured in accordance with an embodiment of the invention. As is generally illustrated, the memory logic includes a data out (DO) portion 102, a data in (DI) portion 104, a bit enable (BE) portion 106, and an address path portion 108. Included within the data in (DI) portion 104, bit enable (BE) portion 106 and address path portion 108 are a series of multiplexers 110 that are used for selective switching between a normal "customer" access path and a local memory domain access path. Multiplexers 110 are controlled by the test signal labeled TESTM1. In the embodiment illustrated, the local domain input/output paths are associated with scan elements of a first architecture (e.g., LSSD), while the customer input/output paths represent a foundry domain having scan elements of a second architecture (e.g., muxed flop scan).

Because existing memory designs have not heretofore provided the capability of complete testablilty of logic around different testing domains, the memory 100 of FIG. 1 further includes flush logic 112 and a pair of observation outputs (ADDROBS) and DO (customer) so as to enable the customer to test the wiring to and from the memory in a foundry environment. Another multiplexer 114, controlled by test signal TESTM3, allows the output of NAND gate 116 (associated with the data input and bit enable signals) to be observed at DO. By buffering an output of NAND gate 118, it will be appreciated that toggling the customer address path 108 by setting TESTM1 to low also causes the ADDROBS pin to toggle, thus providing an observation point for the customer logic domain. Although not specifically shown in FIG. 1, a similar circuit may be included for providing an observation point for the system clock signal Array_C.

Whereas the memory address observation output ADDROBS represents an additional output pin to the customer, the flush logic 112 enables an existing data output pin DO to serve as an observation output during foundry logic testing. More specifically, the flush logic 112 is used in conjunction with the memory system clock signal (Array_C) to selectively flush various signals such as clocks, addresses, data-in, bit-enable, and read/write input signals to the observation or data-out pin DO. In such an operational mode, the memory cells are not accessed. This enables a customer in a foundry test environment to test the wiring to and from the memory structure. In addition, the present configuration further allows for the operation of a memory/BIST combination so as to test the internal SRAM robustness and thus make any redundancy corrections that are needed. Moreover, the structure is also made compatible with an ASIC design by grounding the L1FLUSH pin to allow the memory system clock signal to operate as usual.

FIG. 2 is a truth table illustrating the selection of values for the TESTM1, TESTM3 and L1FLUSH control signals corresponding to the various test and functional modes of the memory system. For example, if TESTM1 is low, then the customer data paths (address, input, bit enable, output) are input in communication with the associated memory logic devices. As such, the memory system may be operated in either a normal (functional mode) or in a test mode of the customer (foundry) logic, depending on the value of TESTM3 and L1FLUSH. For a functional mode, TESTM3 is set to "0" to allow memory array data to pass through to output pin DO, while L1FLUSH is also set to "0" to allow the flush logic 112 to pulse the array system clock signal to the master latch L1.

To test the foundry logic, TESTM3 is set to "1" to direct the NANDed customer input and bit enable signals to be observed at the customer DO pin. Furthermore, L1FLUSH is set to 1, causing the output of flush logic 112 (i.e., the input system clock signal of LSSD latch L1) to remain high and thus flushing the foundry logic test data through to DO.

On the other hand, when TESTM1 is high, then the internal memory data paths are input in communication with the memory BIST logic devices. As such, the memory system may be operated in an external test mode of the memory BIST logic, or a BIST and repair mode, depending on the value of TESTM3. If TESTM3 is set to "1", the NANDed ASIC input and bit enable signals of the memory are internally observed at L1. Conversely, if l TESTM3 is set to "0", a BIST and repair mode is activated. It will be noted that, regardless of the value of TESTM3, the value of L1FLUSH is considered as a "don't care" state, since a high value of TESTM1 renders the top input of the OR gate of the flush logic low. Thus, a pulse on the system clock signal Array_C is unaffected by the value of L1FLUSH when TESTM1 is high.

Figure 3:
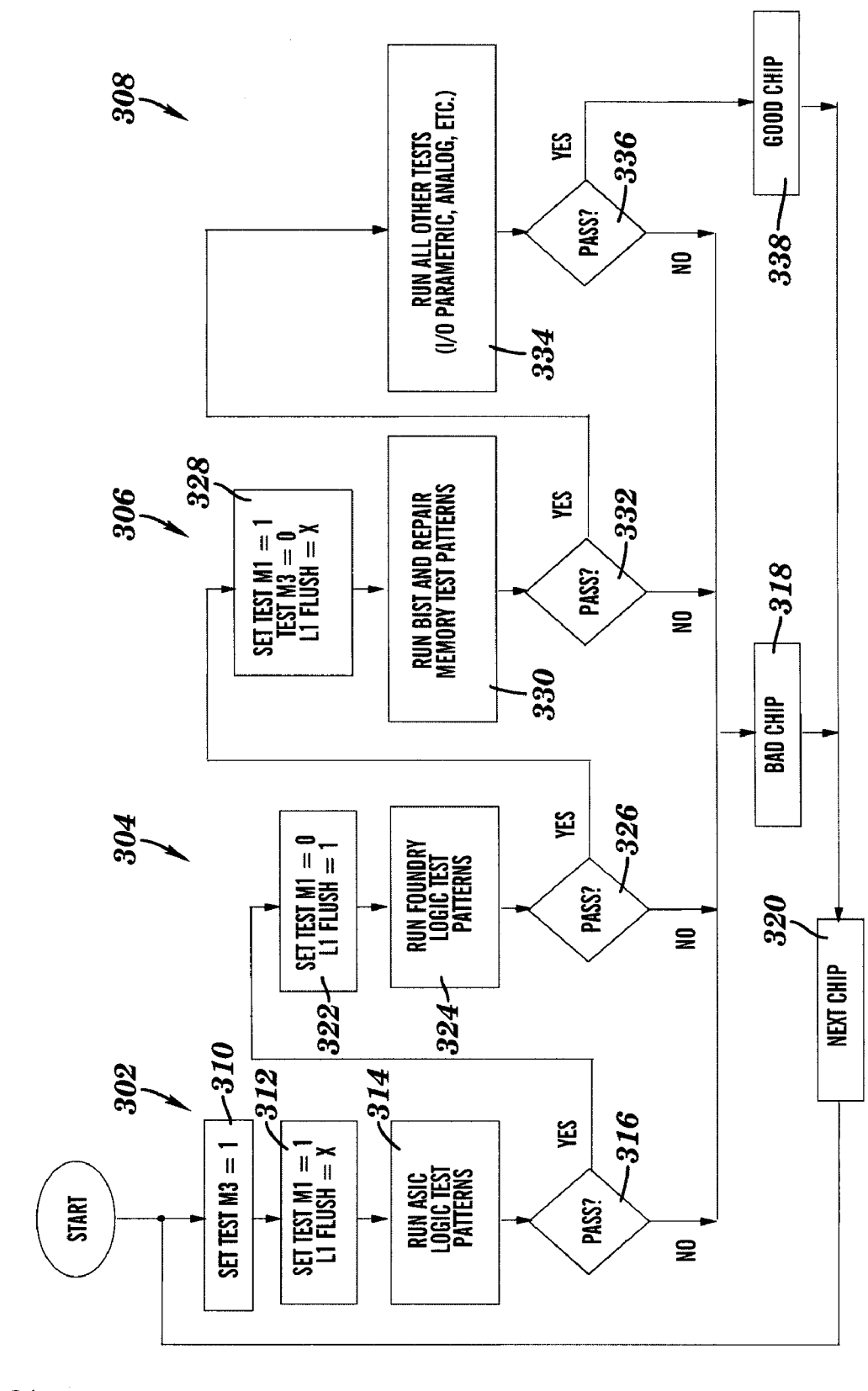
FIG. 3 is a flow diagram illustrating a method for implementing multiple test methodologies for a memory device, in accordance with a further embodiment of the invention.

Finally, FIG. 3 is a flow diagram illustrating a method 300 for implementing multiple test methodologies for a memory device, in accordance with a further embodiment of the invention. In the embodiment illustrated, the method 300 may be utilized in conjunction with the modified memory structure 100 shown in FIG. 1. Again, the method 300 is designed to provide 100% testability of logic around an ASIC device, such as an SRAM using LSSD scan elements, while the "foundry" chip logic domain uses a different test methodology (such as mux-scan) with respect to the BIST logic domain around the memory. Again, although LSSD and mux-scan architectures are used in the exemplary embodiments, it will be appreciated the principles herein are also generally applicable to systems having a scan architecture of a first type and a scan architecture of a second type.

As shown in FIG. 3, the method 300 implements four general testing sub-procedures 302, 304, 306, 308, covering the ASIC (LSSD) logic test patterns, the foundry (mux-scan) logic test patterns, BIST and memory repair test patterns, and other miscellaneous test, respectively. In the example illustrated, the ASIC logic test domain contains the memory and the LSSD self-test logic. All other foundry logic is considered to be outside of the ASIC logic test domain boundary. Moreover, the ASIC input boundary is defined at the self-test input muxes 110 controlled by TESTM1 (FIG. 1), while the ASIC output boundary is defined at the observation outputs of the memory (e.g., ADDROBS, DO, and a clock observation point).

The method 300 begins with probing the first chip in the sample. In the ASIC logic testing sub-procedure 302, the control signal TESTM3 is set to "1" to prevent "x" states within the memory array from being accessed during the ASIC logic test, as shown at block 310. Then, as shown in block 312, by setting and holding control signal TESTM1=1, only the ASIC BIST logic paths are propagated through the self-test input mux and, in the case of the STADDR path, through the NAND gate 118. An LSSD latch (not shown in FIG. 1) observes the data coming out of NAND gate 118. FIG. 1 does however show the LSSD latch L1, L2, that observes the data coming from NAND gate 116 corresponding to the data in and bit enable signals. Because TESTM1 is set to "1", the value of the L1FLUSH signal is not relevant for the ASIC logic test mode.

Once the multiplexer signals are set, the ASIC logic patterns are run and the results are observed, as shown in block 314. If at decision block 316, the chip passes the ASIC logic testing, the method proceeds to sub-process 304. Otherwise, the chip is deemed "bad" at block 318, a new chip is selected at block 320. The new chip is then subjected to testing, beginning with ASIC logic subroutine 302.

Assuming, however, that the initial chip passes the ASIC logic subroutine 302, method 300 proceeds to block 322 of foundry logic sub-process 304. The signal TESTM1 is reset and held to "0" and TESTM3 is set and held to "1" while the foundry logic test patterns are run. In this case, the L1FLUSH signal is now set and held to "1" so as to hold the DO L1 latch(es) in a "flush" state, thereby allowing the output of the DI and bit enable (BE) NAND gate 116 to be observed at the DO pin by the foundry logic through the use of a mux-scan latch added outside the ASIC domain. Since the DI and BE are signals that are driven to the memory by foundry latches, it is desirable to observe these signals into foundry latches as well. The TESTM1 input muxes 110 are observed through the ADDROBS pin and clock observation pin (not shown in FIG. 1) into an external foundry latch (not shown in FIG. 1), for the purpose of insuring that the foundry ADDR and CLK signals in fact arrived at the memory boundary.

After the foundry logic test patterns are run at block 324, decision block 326 determines whether the initial chip has passed the foundry logic test. If so, the method 300 then proceeds to the BIST and Repair sub-procedure 306, which is implemented to enable a foundry customer to obtain improved memory yields. On the other hand, if the initial chip does not also pass the foundry logic test, then the chip is deemed "bad" (block 318), a new chip is selected (block 320) and testing is started over again beginning with the ASIC logic test subroutine 302.

In the BIST and Repair sub-procedure 306, the signal TESTM1 is again set to "1" while TEST M3 is set to "0", thus isolating the output of the DI and bit enable (BE) NAND gate 116 from the DO pin. Again, since TESTM1 is "1", the state of L1FLUSH is considered as a "don't care" state. After the BIST and Repair Memory test patterns are run at block 330, decision block 332 determines whether the chip passed this portion of the testing. If not, the chip is deemed "bad" (block 318), a new chip is selected (block 320) and testing is started over again beginning with the ASIC logic test subroutine 302. However, if this third type of testing is successful, the method 300 finally proceeds to sub-process 308 for other testing, as shown in block 334. If these final tests are passed (decision block 336), the chip is deemed "good" at block 338, and a new chip is selected (block 320) and testing is started over again beginning with the ASIC logic test subroutine 302. If the final tests are not passed, the chip is deemed "bad" (block 318), a new chip is selected (block 320) and testing is started over again beginning with the ASIC logic test subroutine 302.

As will be appreciated, through the use of the above described apparatus and test methodology, complete logic test coverage of the self-test interface (having two distinct test methodologies merged together) may be achieved, in addition to memory yield improvement through the use of redundancy in the memory. The organization of the memory may vary across the spectrum, where each individual array may be contained in one large boundary, or each memory may exist in its own boundary, with multiple boundaries on the chip.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A memory structure configured for supporting multiple test methodologies, comprising:
   a first plurality of multiplexers configured for selectively coupling at least one data input path and at least one address path between an external customer connection and a corresponding internal memory connection associated therewith;
   a second multiplexer configured for selectively coupling an input of a test latch between a functional memory array connection and a memory logic connection, said memory logic connection coupled to said at least one data input path, with an output of said test latch defining a data out customer connection; and
   flush logic configured to direct data from said memory logic connection to said data out customer connection during a test of logic associated with a customer chip, thereby facilitating observation of said memory logic connection at said customer chip;
   wherein test elements of the memory structure comprise a scan architecture of a first type and test elements of said customer chip comprise a scan architecture of a second type.

2. The memory structure of claim 1, wherein said scan architecture of a first type further comprises a level sensitive scan design (LSSD), and scan architecture of a second type further comprises a muxed-flop design.

3. The memory structure of claim 1, further comprising at least one external observation pin for said customer chip, said at least one external observation pin coupled to one or more of: said at least one address path of the memory structure, and a system clock path of the memory structure.

4. The memory structure of claim 1, wherein:
   a first control signal applied to said first plurality of multiplexers comprises one of a first state and a second state;
   said first state corresponding to one of: a functional mode of the memory structure, and a test mode of said logic associated with said customer chip; and
   said second state corresponding to one of: a test mode of logic associated with the memory structure, and a built-in self test (BIST) and repair mode of the memory structure.

5. The memory structure of claim 4, wherein:
   a second control signal applied to said second multiplexer comprises one of a first state and a second state;
   said first state corresponding to one of: said functional mode of the memory structure, and said BIST and repair mode of the memory structure; and
   said second state corresponding to one of: said test mode of said logic associated with said customer chip, and said test mode of logic associated with the memory structure.

6. The memory structure of claim 5, further comprising a flush logic control signal applied to said flush logic, wherein:
   said flush logic control signal is set to a first state in said functional mode of the memory structure;

said flush logic control signal is set to a second state in said test mode of said logic associated with said customer chip; and said flush logic control signal is considered to be in a don't care state in said test mode of logic associated with the memory structure and in said BIST and repair mode of the memory structure.

7. The memory structure of claim 1, wherein said first plurality of multiplexers is further configured for selectively coupling at least one bit enable path between an external customer connection and a corresponding internal memory connection associated therewith.

* * * * *